(12) United States Patent
Kim

(10) Patent No.: US 7,300,746 B2
(45) Date of Patent: Nov. 27, 2007

(54) PHOTOMASK FOR FORMING SMALL CONTACT HOLE ARRAY AND METHODS OF FABRICATING AND USING THE SAME

(75) Inventor: In-sung Kim, Suwon (KR)

(73) Assignee: Samsung Electronics, Co., ltd., Suwon-si (KR)

( * ) Notice: Subject to any disclaimer, the term of this patent is extended or adjusted under 35 U.S.C. 154(b) by 123 days.

(21) Appl. No.: 11/328,788

(22) Filed: Jan. 10, 2006

(65) Prior Publication Data

US 2006/0110684 A1 May 25, 2006

Related U.S. Application Data

(62) Division of application No. 10/392,590, filed on Mar. 20, 2003, now Pat. No. 7,022,438.

(30) Foreign Application Priority Data

Jul. 25, 2002 (KR) ............................... 2002-43897

(51) Int. Cl.
*G03C 5/00* (2006.01)
(52) U.S. Cl. ...................... 430/311; 430/319; 430/320; 430/325

(58) Field of Classification Search ................ 430/311, 430/319, 320, 325
See application file for complete search history.

(56) References Cited

U.S. PATENT DOCUMENTS

| | | | | |
|---|---|---|---|---|
| 6,114,095 | A | * | 9/2000 | Nakabayashi et al. ...... 430/311 |
| 6,524,751 | B1 | * | 2/2003 | Stanton et al. ................. 430/5 |
| 7,022,438 | B2 | * | 4/2006 | Kim .............................. 430/5 |

\* cited by examiner

*Primary Examiner*—Christopher G. Young
(74) *Attorney, Agent, or Firm*—F. Chau & Associates, LLC

(57) ABSTRACT

Photomasks that are used to form a fine contact hole array, a method of fabricating the photomask, and use of the photomask. The photomask includes a transparent substrate; a plurality of line-type opaque patterns being formed on the transparent substrate, for defining floodlighting portions for forming patterns; and phase-shifting regions being arranged on the transparent substrate between the opaque patterns at predetermined intervals, the phase-shifting regions defining floodlighting portions for contact holes. A fine and dense contact hole array can be easily formed using the photomask together with a customized illumination. Therefore, a fine contact hole of a good quality can be formed directly on a photoresist using the photomask without additional processes.

8 Claims, 15 Drawing Sheets

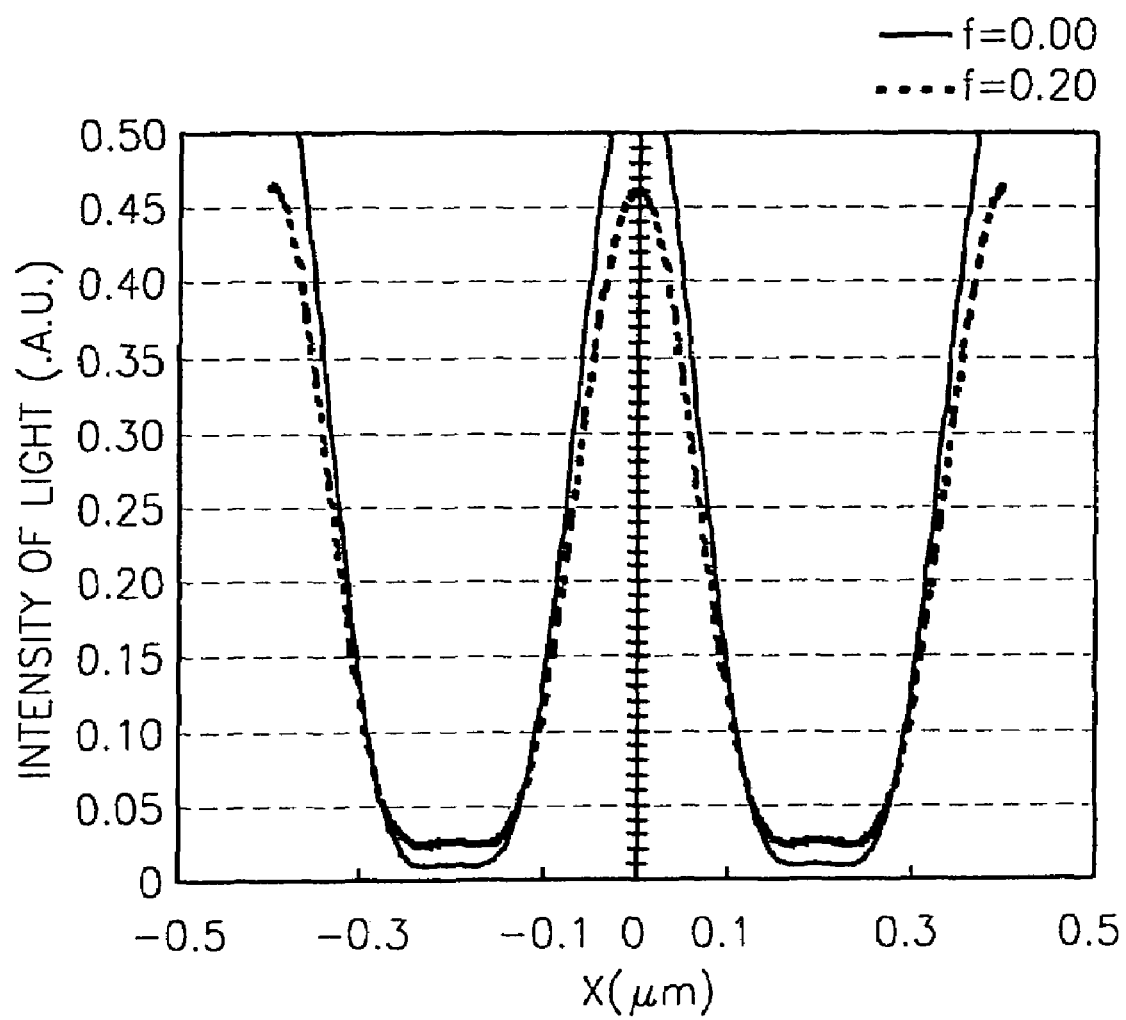

(a)

(b)

(a)

(b)

(a)

(b)

(a)

(b)

(a)

(b)

(a)

(b)

(a)

(b)

PHOTOMASK FOR FORMING SMALL CONTACT HOLE ARRAY AND METHODS OF FABRICATING AND USING THE SAME

CROSS REFERENCE TO RELATED APPLICATION

This application is a Divisional of U.S. patent application Ser. No. 10/392,590 filed on Mar. 20, 2003, now U.S. Pat. No. 7,022,438 which is fully incorporatd herein by reference and which claims priority to Korean Patent Application No. 2002-43897, filed Jul. 25, 2002 in the Korean Intellectual Property Office (KIPO), which is fully incorporated herein by reference.

FIELD OF THE INVENTION

The present invention relates generally to a photomask for manufacturing a semiconductor device and a method of forming patterns using the photomask. More particularly, the invention relates to a photomask used to form a small contact hole array, a method of fabricating the photomask, and a method of forming patterns using the photomask.

BACKGROUND

Photomask images or patterns, which define various elements in a photolithography process, are focused on a photoresist using light. To realize tiny features, finer images must be focused on the photoresist, and optical resolution must be increased. However, there are limits to the resolution that can be attained.

Reduction in a line width of a device results in a reduction of the size of a contact region. In general, a contact region is more difficult to form than line and space patterns. This problem has resulted in the development of various techniques of forming a fine contact hole. The size of a contact hole in dynamic random access memory (DRAM) is almost the same as the line width of an interconnect wiring, such as a bit line or a metal interconnection. However, formation of a contact hole pattern using lithography is still far more difficult than that of an interconnect wiring. That is, a fine contact hole of a desired size is difficult to form only using lithography. In general, a fine contact hole of a desired size is made by patterning a photoresist through a photo process and then performing an additional process, for example, a thermal flow process, on the patterned photoresist. Otherwise, a fine contact hole may be formed using various techniques in a lithography process, for example, a contact hole may be etched using a slope etch.

However, an increase in the number of processes for manufacturing a semiconductor device results in an increase in manufacturing costs. Further, as additional processes are involved, the degree of distribution of the line width of a device worsens. Accordingly, it is necessary to develop a resolution enhancement technique (RET) of directly transferring a fine contact hole of good quality onto a photoresist using a photolithography process.

Meanwhile, an alternating phase-shifting mask (PSM) allows the direct transfer of a fine contact hole pattern onto a photoresist while securing reproducibility and stability. In general, it is possible to form a fine contact hole with better resolution and obtain a more sufficient process margin by using the alternating PSM, as opposed to using a binary mask or an attenuated PSM. Nevertheless, the alternating PSM has not been widely used mainly due to its three-dimensional (3D) structure. An alternating phase of a contact hole array is made by etching quartz. The use of the etched quartz, however, causes problems such as a 3D effect, a phase error, and phase conflict. Accordingly, technology and a method for preventing the occurrence of such problems are required to manufacture a photomask.

SUMMARY OF THE INVENTION

An embodiment of the present invention provides a photomask that can be used to form a fine contact hole.

Another embodiment of the present invention also provides method of manufacturing such a photomask.

Another embodiment of the present invention also provides a method of forming a fine contact hole using such a photomask.

According to an embodiment of the present invention, there is provided a photomask including a transparent substrate; a plurality of line-type opaque patterns that are formed on the transparent substrate and define floodlighting portions for forming patterns; and phase-shifting regions that are arranged on the transparent substrate between the opaque patterns at predetermined intervals and define floodlighting portions for contact holes.

The opaque pattern is an opaque layer or a transmissive phase-shifting layer. The phase-shifting regions phase-shift incident light by 180°±30°. The phase-shifting regions are recesses that are formed by etching the transparent substrate to a predetermined depth. Alternatively, the phase-shifting regions are oxide layer patterns having a different refractive index from the transparent substrate. The oxide layer pattern can be a spin-on-glass (SOG) layer pattern.

According to another embodiment of the present invention, there is provided a method of fabricating such a photomask, and a method of forming patterns using a combination of a photomask and customized illumination. The customized illumination is set to optimize focusing of the $0^{th}$ and $1^{st}$ components of incident light. For instance, preferably, customized illumination is dipole illumination if floodlighting portions for contact holes are used to form a bit line contact hole array for DRAM.

As described above, a fine and dense contact hole array can be easily formed by using a photomask and customized illumination according to an embodiment of the present invention since resolution and process latitude are increased according to an embodiment of the present invention. Also, even an ultra-fine contact hole array can be formed more appropriately when using a photomask according to an embodiment of the present invention, than when using an attenuated PSM. Thus, it is possible to form a fine contact hole of good quality directly on a photoresist during a photolithography process without needing a mask with a complicated structure and additional processes.

BRIEF DESCRIPTION OF THE DRAWINGS

The above aspects and advantages of the present invention will become more apparent by describing in detail preferred embodiments thereof with reference to the attached drawings in which:

FIG. 3C is a graph illustrating the intensity of the light shown in FIGS. 3A and 3B, taken along the line c-c';

DETAILED DESCRIPTION OF PREFERRED EMBODIMENTS

Figure 1A:
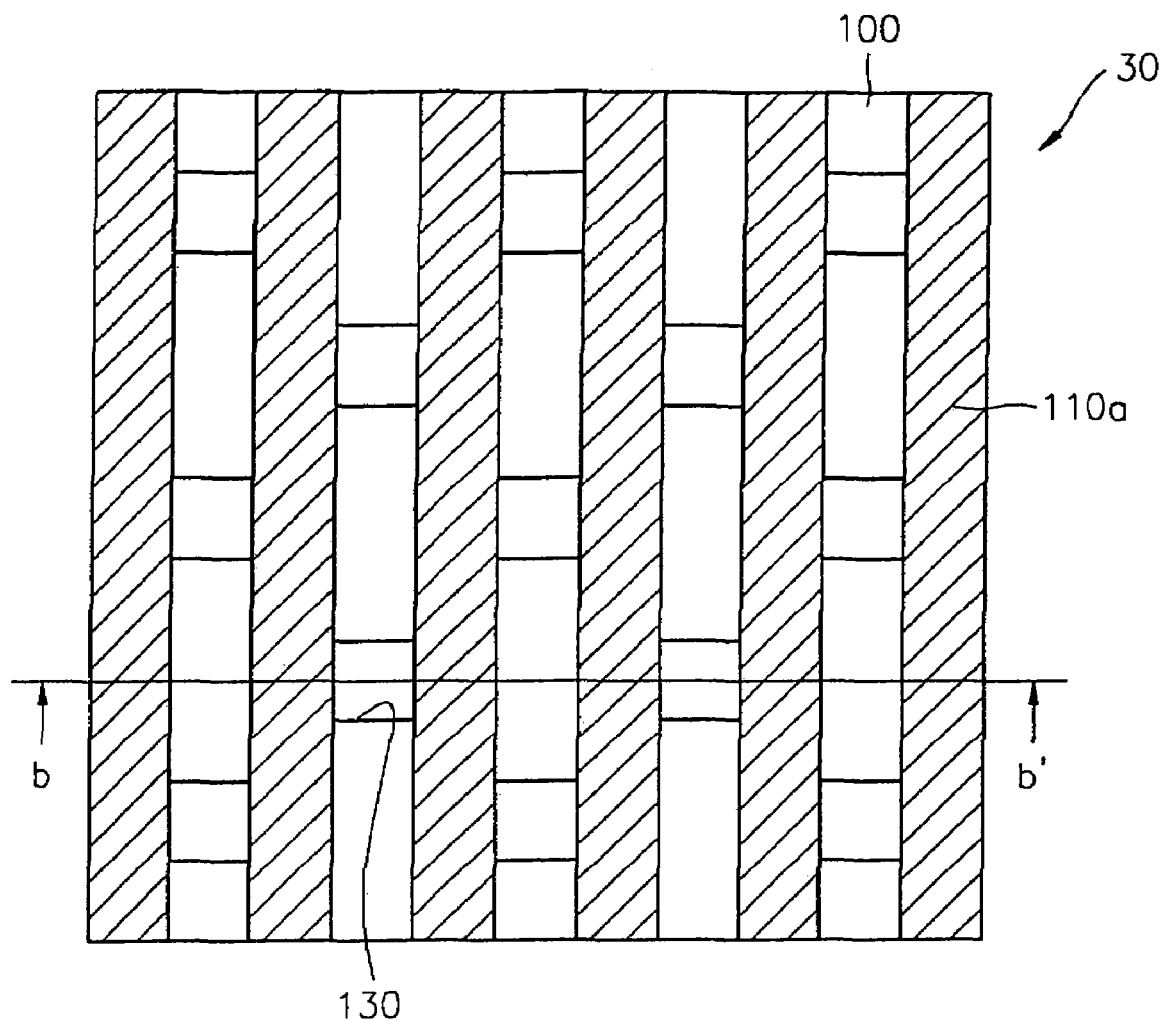
FIG. 1A is a top view of a photomask according to an embodiment of the present invention.

The present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete and will fully convey the concept of the invention to those skilled in the art. The same reference numerals in different drawings represent the same or similar elements, and thus, their descriptions will be omitted.

Figure 1B:
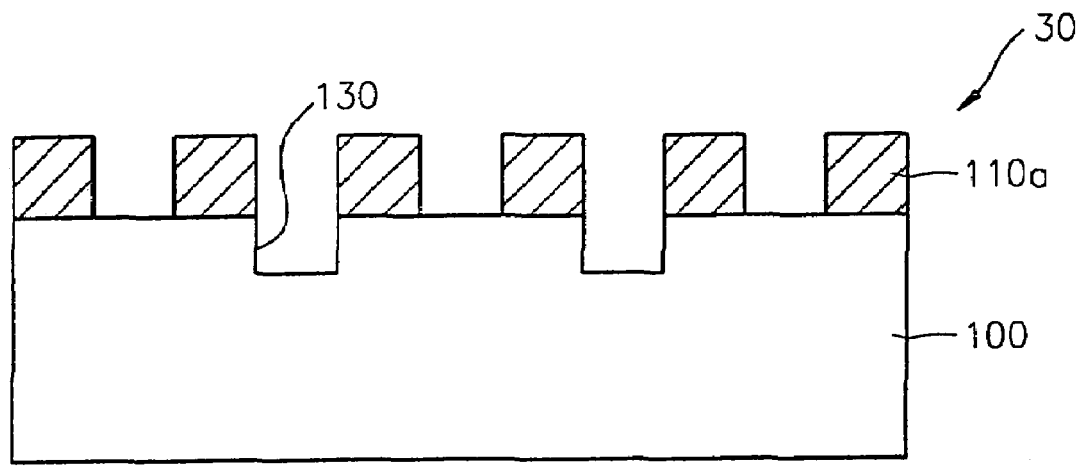
FIG. 1B is a cross-sectional view of the photomask of FIG. 1A, taken along the line b-b'.

FIG. 1A is a top view of a photomask 30 according to an embodiment of the present invention, and FIG. 1B is a cross-sectional view of the photomask 30 of FIG. 1A, taken along the line b-b'.

Referring to FIGS. 1A and 1B, the photomask 30 is formed on a transparent substrate 100. The transparent substrate 100 is formed of a material, e.g., quartz and silica glass, having optical and mechanical properties that are proper for a photolithography process.

A plurality of line-type opaque patterns 110a are formed on the transparent substrate 100 to define floodlighting portions for forming patterns. The opaque patterns 110a are formed of a material that is capable of substantially preventing transmission of incident light. For instance, the opaque pattern 110a may be an opaque layer or transmissive phase-shifting layer. The transmissive phase-shifting layer may be formed of any thick material that can reduce the intensity of incident light within a range from 1% to 35%. Preferably, the opaque pattern 110a is formed of metal, such as Cr of a thickness from about 100 Å to about 10000 Å. Alternatively, the opaque pattern 110a can be formed of a MoSi, $Cr_2O_3$, Mo, Al, W, or Ti compound. However, there is no limit to the type of material used for, and the thickness of, the opaque pattern 110a. The material and thickness thereof may vary based on a required process of fabricating a photomask.

A recess 130 is formed at predetermined intervals on the transparent substrate 100 between the opaque patterns 110a, the recess 130 being formed by etching the transparent substrate 100 to a predetermined depth. Incident light can be phase-shifted by 180°±30° depending on the depth of the recess 130. Preferably, the recess 130 phase-shifts incident light by 180°. The recess 130 is referred to herein as a "phase defect" in this disclosure because it is a region that is formed on purpose to cause a phase difference between the recess 130 and neighboring regions. As shown in FIG. 1B, the formation of the recesses 130 on the transparent substrate 100 results in regularly periodical unevenness of the transparent substrate 100. Patterns are not formed around the recesses 130 where the intensity of diffracted light decreases due to phase-shifting thus causing a striking contrast with other regions. The recesses 130 are positioned at the floodlighting portions defined by the opaque patterns 110a and prevent transmission of light to some areas of the floodlighting portions, thereby defining the floodlighting portions for contact holes encircled by two recesses 130 and both of the opaque patterns 110a. In particular, the layout of the photomask in FIG. 1A is suitable to form a contact hole array, such as a bit line contact hole array of dynamic random access memory (DRAM). A line width of the opaque pattern 110a and the size and array of the recess 130 may be changed according to the size and array of contact holes. A photomask according to an embodiment of the present invention is applicable to various fields, as well as to a process of fabricating DRAM.

Figure 2A:
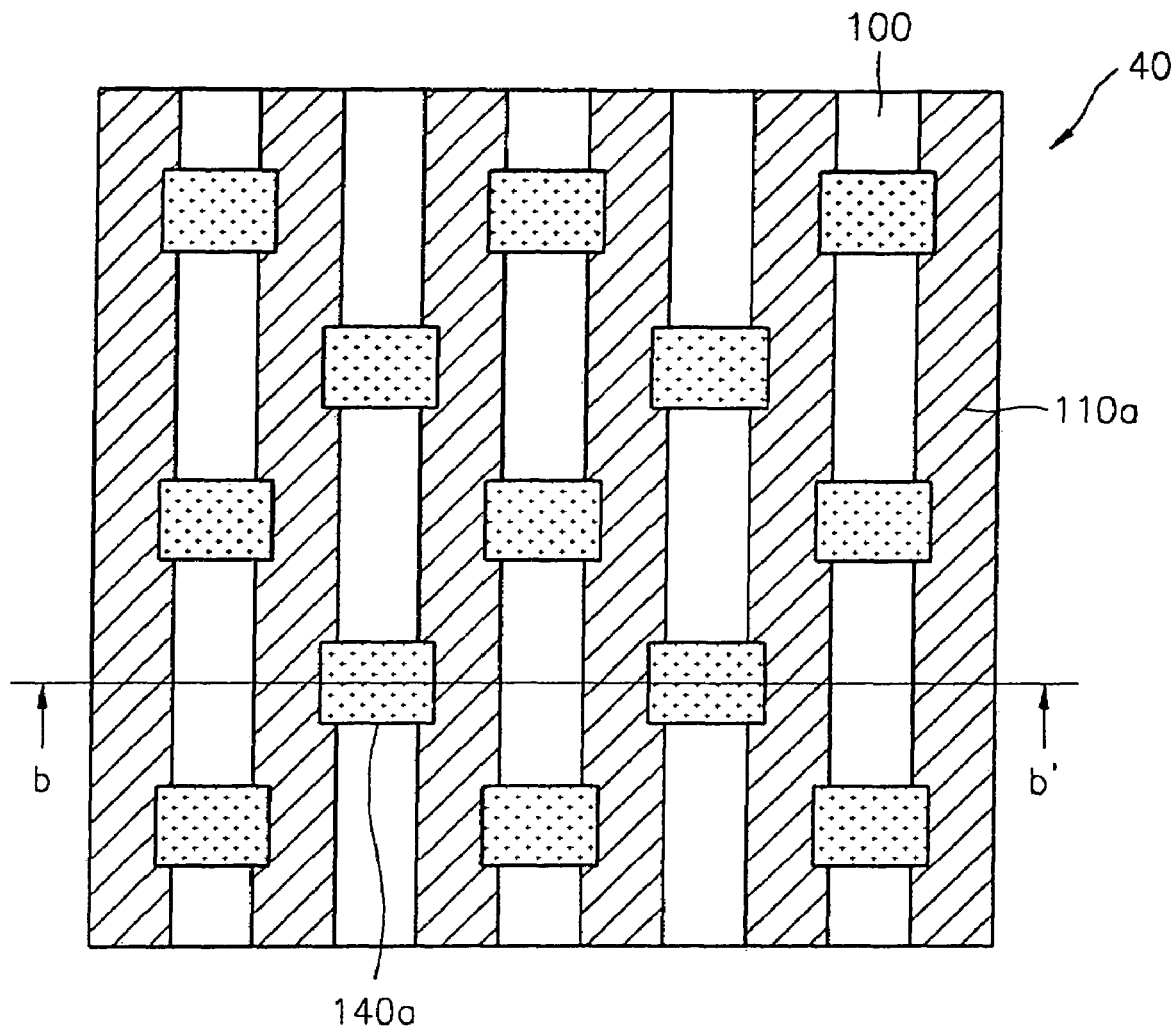
FIG. 2A is a top view of a photomask according to an embodiment of the present invention.
Figure 2B:
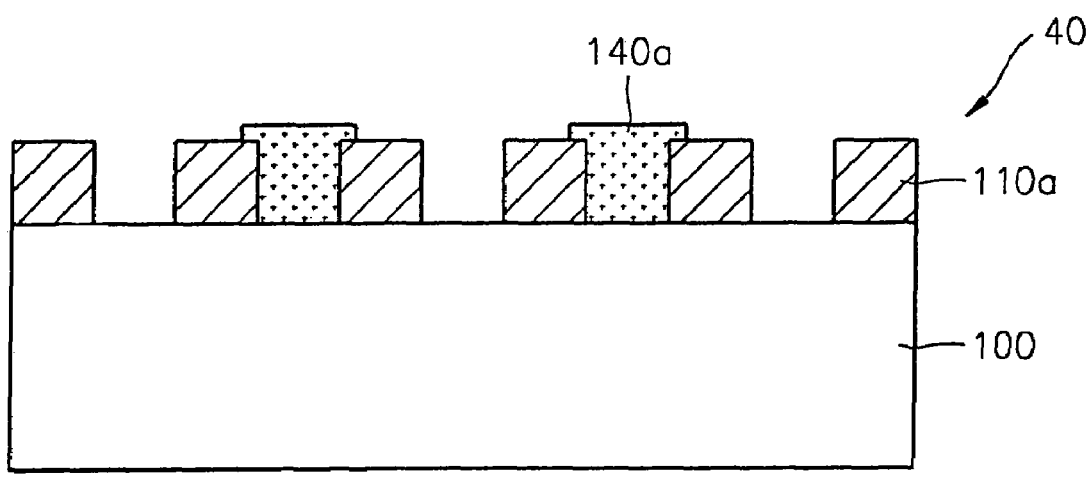
FIG. 2B is a cross-sectional view of the photomask of FIG. 2A, taken along the line b-b'.

FIG. 2A is a top view of a photomask 40 according to another embodiment of the present invention, and FIG. 2B is a cross-sectional view of the photomask 40, taken along the line b-b'.

Referring to FIGS. 2A and 2B, the photomask 40 is formed on a transparent substrate 100. Oxide layer patterns 140a are arranged on the transparent substrate 100 between opaque patterns 110a at predetermined intervals. The oxide layer pattern 140a is formed of a material, for example, a spin-of-glass (SOG), having a different refractive index from the transparent substrate 100. The oxide layer pattern 140a is a "phase defect" that is formed to phase-shift incident light by 180°±30°, such as, the recess 130 of FIG. 1A as discussed above. Similarly, the oxide layer patterns 140a are positioned at floodlighting portions defined by the opaque patterns 110a and prevent transmission of incident light to some areas of the floodlighting portions, thereby defining floodlighting portions for contact holes encircled by two oxide layer patterns 140a and both of the opaque patterns 110a.

As described above, a phase-shifting region, such as the recess 130 of FIG. 1A and the oxide layer pattern 140a, is set in a phase defect array and defines floodlighting portions for contact holes together with the opaque pattern 110a. Patterns are not formed around the phase defect array where the intensity of diffracted light decreases due to phase-shifting, as a result, a striking contrast with other regions is caused. Thus, it is possible to form a pattern having a good profile when performing exposure of a photoresist applied on a wafer.

Preferably, a customized illumination is used to form a photoresist pattern on a wafer using a photomask according to an embodiment of the present invention. The customized illumination, which is used to form a particular pattern, can be set with a pupil diagram (or pupil-o-gram). The pupil diagram uses a pinhole camera technique, wherein a small transparent spot (or pin hole) in an opaque photomask or a small opaque spot (or reverse pin hole) in a transparent mask is projected onto an image plane. Light passing through the pinhole or around the reverse pinhole forms a pupil diagram image at some distance over the wafer plane, typically, a distant of 10-30 mm from the wafer plane. The pupil diagram image can be captured on a photosensitive film. The pupil diagram corresponds to pupil illumination at the pupil of projection lens and can be quantitatively evaluated to determine if the distribution of illumination corresponds to the expected results, given the projector settings.

The customized illumination according to the present invention preferably is an illumination that is designed to optimize focusing of the $0^{th}$ and $1^{st}$ components of incident light. The customized illumination for the photomask 30 of FIG. 1A is preferably a dipole illumination.

A computer simulation was performed using photomask 30 of FIG. 1A and dipole illumination so as to evaluate an effect of a combination of a photomask according to an embodiment of the present invention and a customized illumination. The results of the simulation as illustrated in FIGS. 3A through 3C were obtained using SOLID-C as a simulation tool.

Figure 3A:
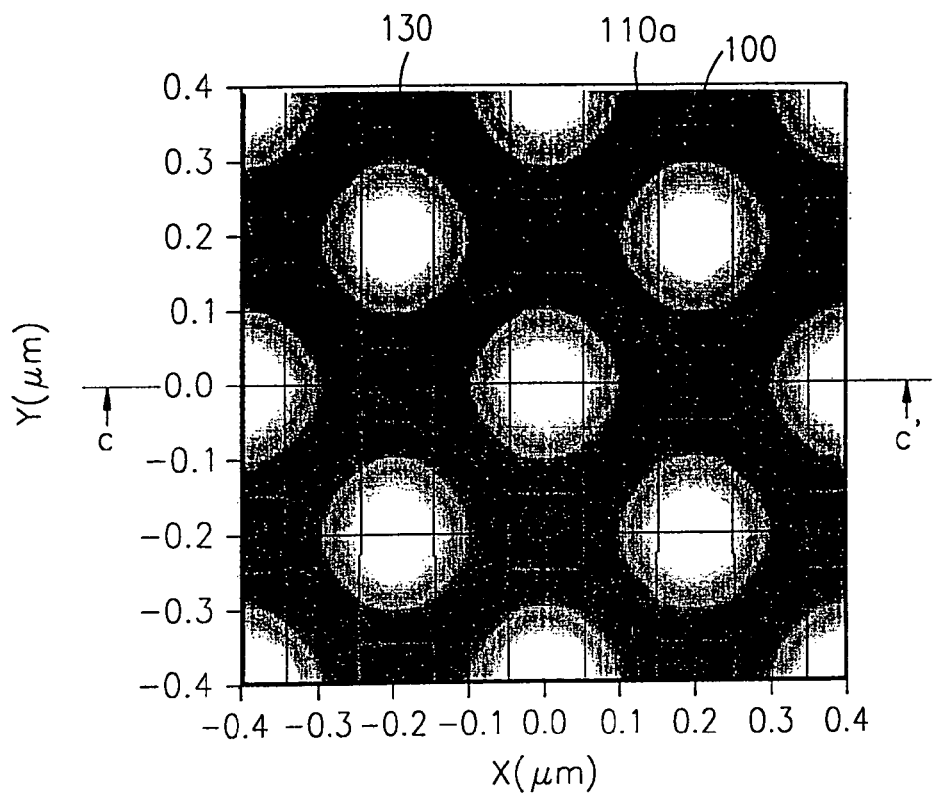
FIG. 3A is a plan view of the distribution of the intensity of light during exposure using the photomask of FIG. 1A.

FIG. 3A is a plan view of distribution of the intensity of incident light projected onto a photoresist of a wafer during exposure using the photomask 30 of FIG. 1A and dipole illumination. Referring to FIG. 3A, an X-axis and Y-axis denote an X-dimension and Y-dimension of the photomask 30, respectively. Here, the X-dimension and Y-dimension are indicated in the unit of μm. In the intensity diagram, bright portions and dark portions correspond to floodlighting regions and opaque regions, respectively. As compared to FIG. 1A, the line-type opaque patterns 110a and the recesses 130 (or the phase defect) are dark regions where the incident light is blocked, and the transparent substrate 100 between the opaque patterns 110a and between the recesses 130 are bright regions where transmission of incident light is allowed. In the distribution of the intensity, the larger degree of brightness of dark region and bright regions, the larger the contrast in luminosity. Referring to FIG. 3A, since the contrast between the dark regions and the bright regions is large, a photomask of a striking contrast image can be obtained according to the present invention.

Figure 3B:
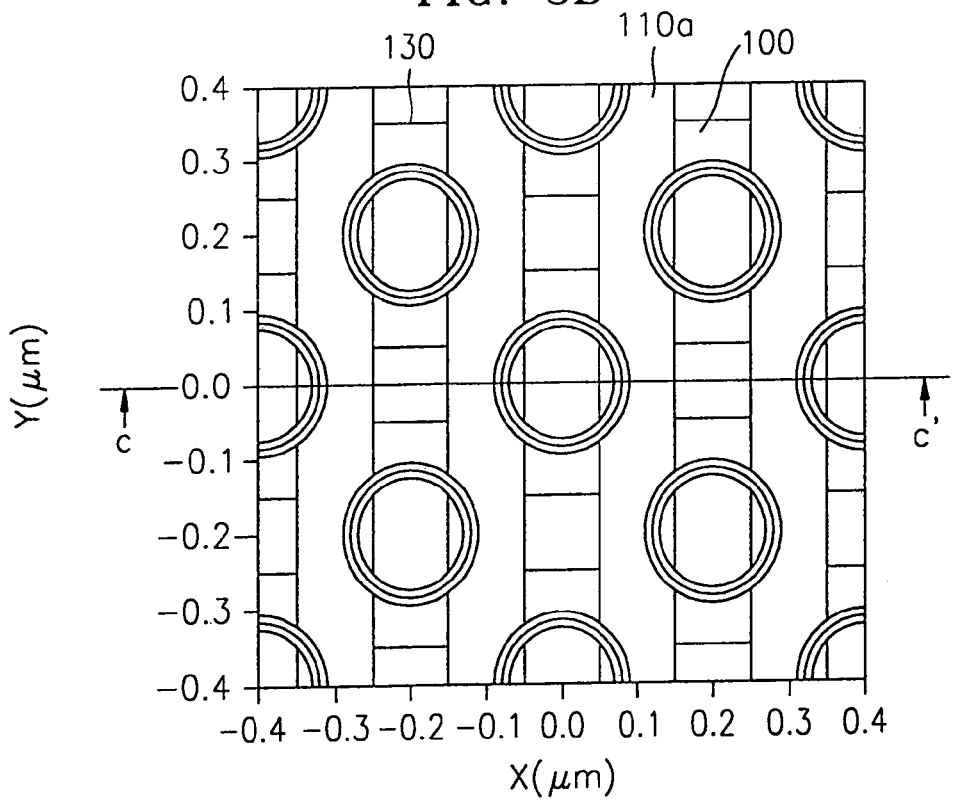
FIG. 3B is a diagram of the contour of a contact hole that can be formed by performing an exposure process using the photomask of FIG. 1A.

FIG. 3B is a diagram illustrating the contour of a contact hole to be formed by exposure using the photomask 30 of FIG. 1A, that is, the contact hole having the distribution of the intensity shown in FIG. 3A. Referring to FIG. 3B, an X-axis and a Y-axis denote an X-dimension and a Y-dimension indicated in units of μm, respectively. The layout shown in FIG. 3B is applicable to an array of a bit line contact hole of a DRAM.

Lastly, FIG. 3C is a graph illustrating the distribution of light intensity, that is, an aerial image, shown in FIGS. 3A and 3B, taken along the line c-c' of FIGS. 3A and 3B. Here, an X-axis indicates an X-dimension in units of μm and a Y-axis indicates the intensity of light (A.U.). Referring to FIG. 3C, a curve of a solid line indicates the intensity of exactly focused incident light, and a curve of a dotted line indicates intensity of incident light that is defocused by 0.20 μm. From the two curves, it is noted that there is no remarkable difference in the intensity of light despite a focus offset between the focused and defocused incident lights. This means that the process margin is increased by the present invention. In other words, it is possible to obtain a good profile of a pattern even though the incident light is defocused due to an error in a manufacturing process or poor topography of a photoresist. Also, the simulation result of FIG. 3C reveals that the intensity of defocused incident light has sufficiently practical optical contrast. Therefore, a combination of a photomask according to an embodiment of the present invention and a customized illumination results in an improvement in a focus margin. For this reason, it is possible to easily form an ultra-fine and denser contact hole array.

To compare the simulation results according to the present invention, a conventional photomask of a contour as shown in FIG. 3B can be manufactured. Then a computer simulation is performed by combining the photomask with conventional illumination. The computer simulations are illustrated in FIGS. 5A through 5C.

Figure 4A:
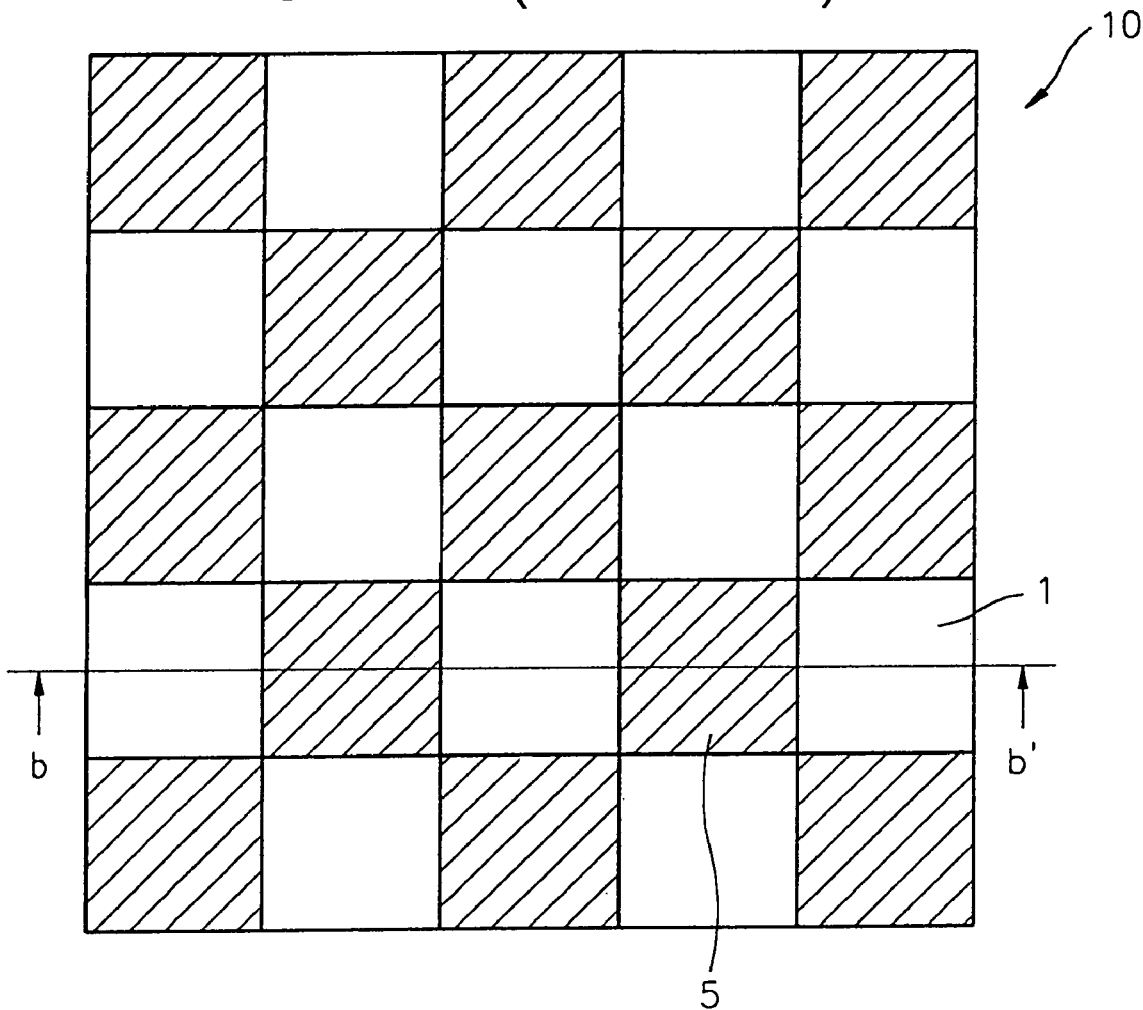
FIG. 4A is a top view of a conventional photomask.

First, a conventional photomask 10 will be described with reference to FIGS. 4A and 4B. FIG. 4A is a top view of the conventional photomask 10 and FIG. 4B is a cross-sectional view of the photomask 10, taken along the line b-b'.

Figure 4B:
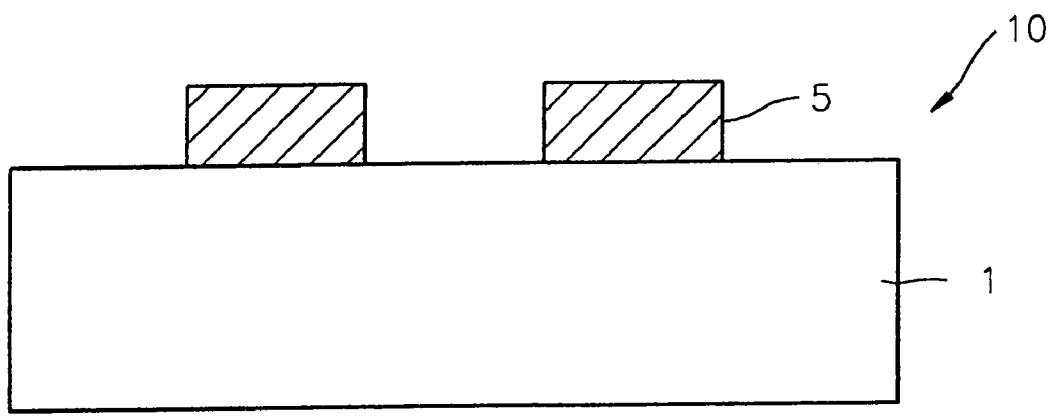
FIG. 4B is a cross-sectional view of the photomask of FIG. 4A, taken along the line b-b'.

Referring to FIGS. 4A and 4B, the photomask 10 is made by forming opaque patterns 5 on a transparent substrate 1 as a mosaic pattern. It is assumed that the opaque pattern 5 is formed of a general 8% attenuated phase-shifting layer.

Figure 5A:
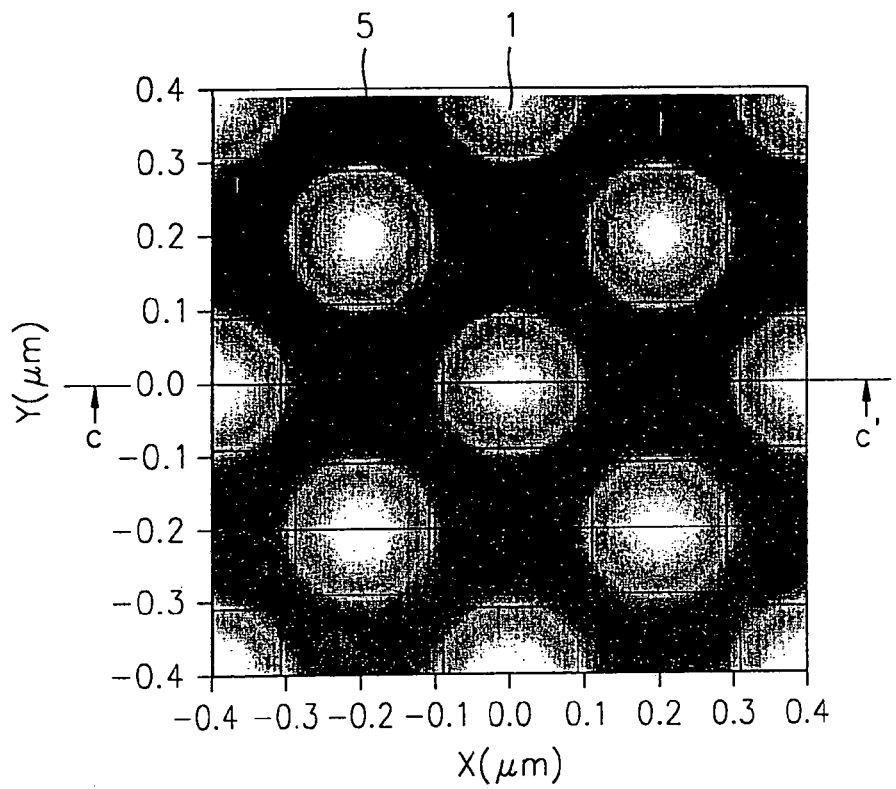
FIG. 5A is a plan view of the distribution of the intensity of light during exposure using the photomask of FIG. 4A.
Figure 5B:
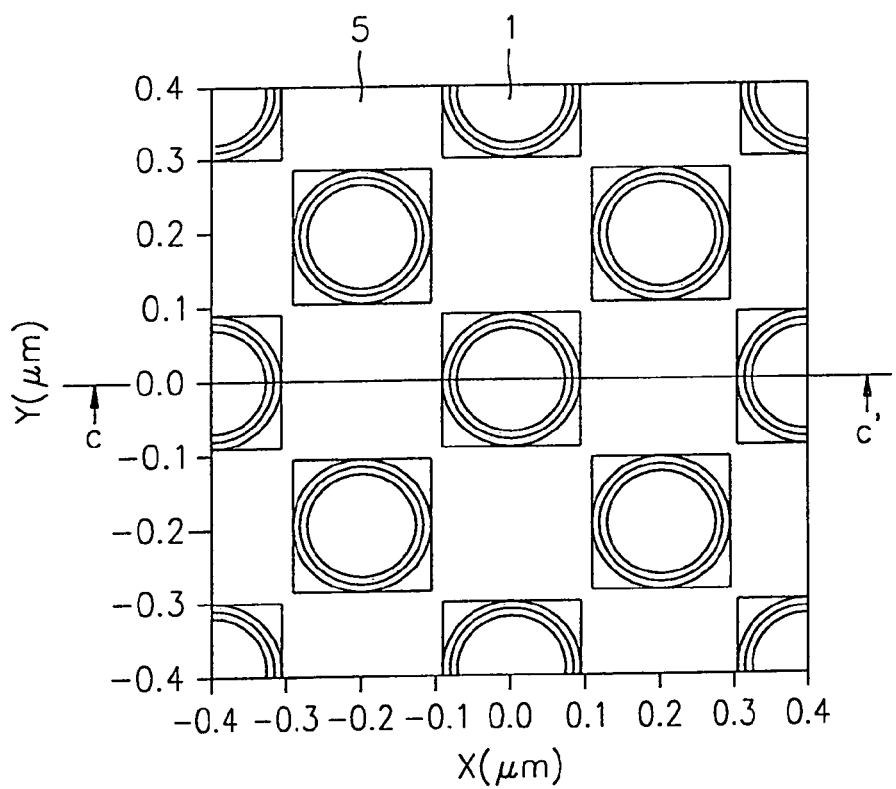
FIG. 5B is a diagram of the contour of a contact hole that can be formed by performing an exposure process using the photomask of FIG. 4A.
Figure 5C:
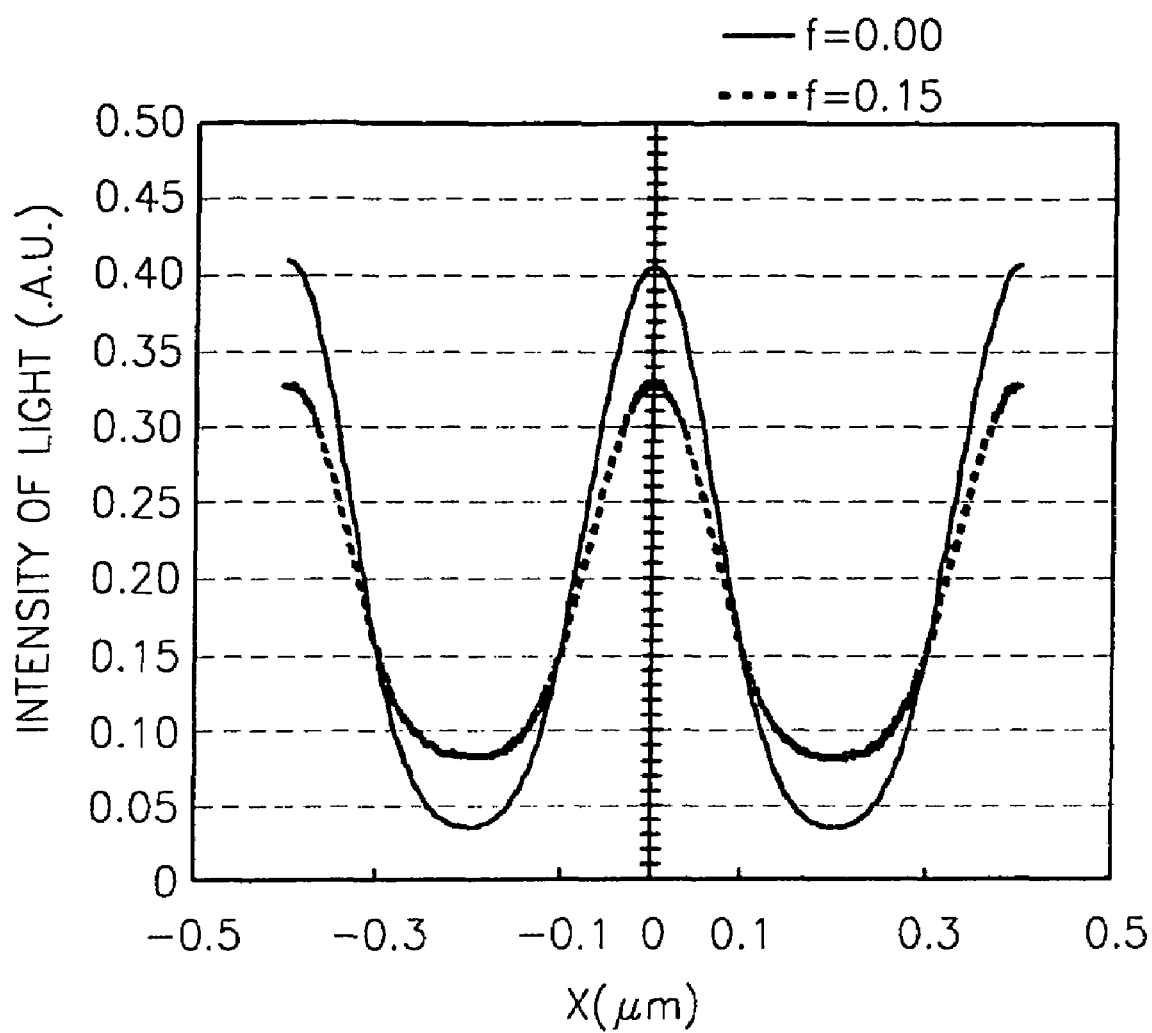
FIG. 5C is a graph illustrating the intensity of light shown in FIGS. 5A and 5B, taken along the line c-c'.

FIG. 5A is a plan view of the distribution of the intensity of incident light during exposure using the photomask 10 of FIG. 4A and conventional illumination. FIG. 5B is a diagram of the contour of a contact hole to be formed by exposure using the photomask 10 of FIG. 4A. In FIGS. 5A and 5B, X-axes and Y-axes denote X-dimensions and Y-dimensions of the photomask 10, indicated in units of μm. Referring to FIGS. 5A and 4A, the opaque patterns 5 are dark regions where incident light is blocked, and the transparent substrate 1 between the opaque patterns 5 are bright regions to which incident light is allowed.

However, contrast between the dark and bright regions, shown in FIG. 5A, is less than in FIG. 3A. A photoresist pattern made when using a photomask and illumination according to the present invention has higher definition than that made when using the conventional photomask and illumination.

Meanwhile, FIGS. 3B and 5B show contact holes having similar contours since a conventional photomask is selected to obtain similar contours of the contact hole of FIG. 3B according to the present invention.

FIG. 5C is a graph illustrating the intensity of incident light shown in FIGS. 5A and 5B, taken along the line c-c'. Here, an X-axis denotes an X-dimension indicated in units of μm and a Y-axis denotes the intensity of light (A.U.). Referring to FIG. 5C, a curve of a solid line indicates the intensity of focused light and a curve of a dotted line indicates that of light that is defocused by 0.15 μm. Although not shown in the drawings, a simulation reveals that the graph as shown in FIG. 5C can be obtained when using the conventional photomask 10 of FIG. 4A and a conventional annular aperture. A comparison of the graphs of FIGS. 3C (present invention) and 5C (prior art) reveals that the intensity of light shown in FIG. 3C is far stronger than in FIG. 5C. Also, although a focus offset between the focused light and the defocused light shown in FIG. 5C is less than in FIG. 3C, the intensity of light in FIG. 5C is still weaker than that in FIG. 3C. Therefore, it is concluded that it is difficult to form a pattern using conventional photomask and conventional illumination, even though incident light is defocused to a very small degree.

Figure 6:
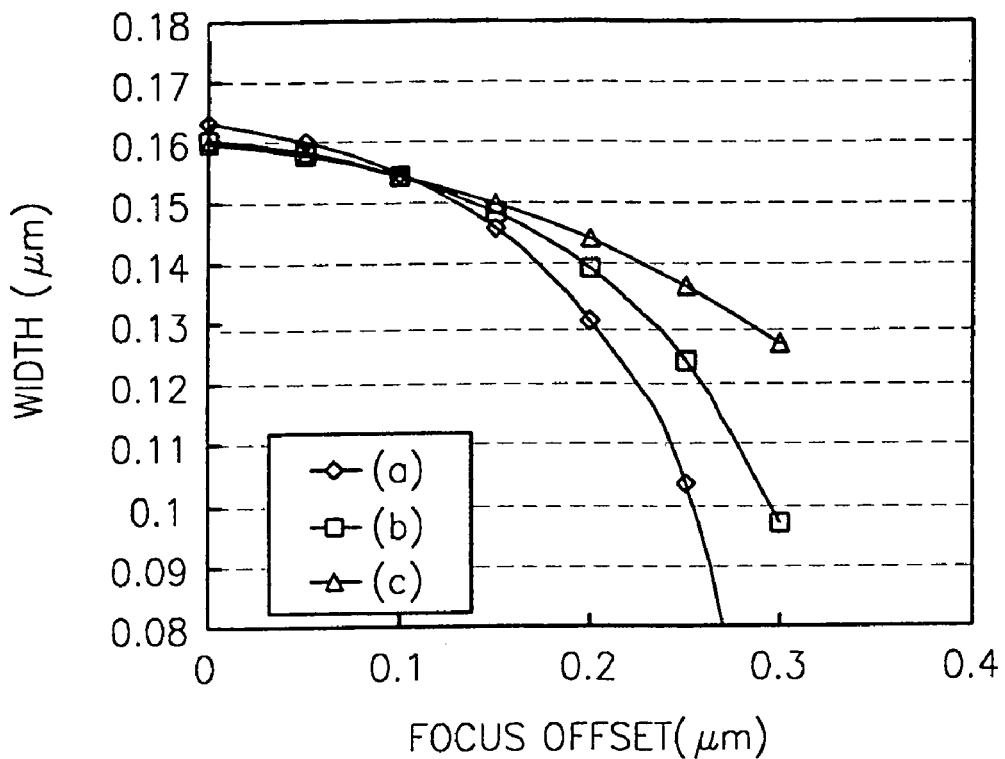
FIG. 6 is a graph illustrating a variation in a line width with respect to a focus offset.

FIG. 6 is a graph illustrating variations in the line widths of a device when using a photomask according to an embodiment of the present invention and when using a conventional photomask. In the graph of FIG. 6, (a) shows a variation in the line width when using the photomask 10 of FIG. 4A and a conventional illumination; (b) shows a variation in the line width when using the photomask 10 of FIG. 4A and a annular aperture; and (c) shows a variation in the line width when using photomask 30 of FIG. 1A and dipole illumination, according to an embodiment of the present invention. As shown in (a) and (b), the larger a focus offset, the greater a variation in the line width. In this case, it is difficult to form a pattern. However, referring to (c) of FIG. 6, there is no remarkable variation in the line width despite an increase in a focus offset, according to an embodiment of the present invention. That is, in the present invention, the depth of focus is increased to improve a focus margin.

Figure 7:
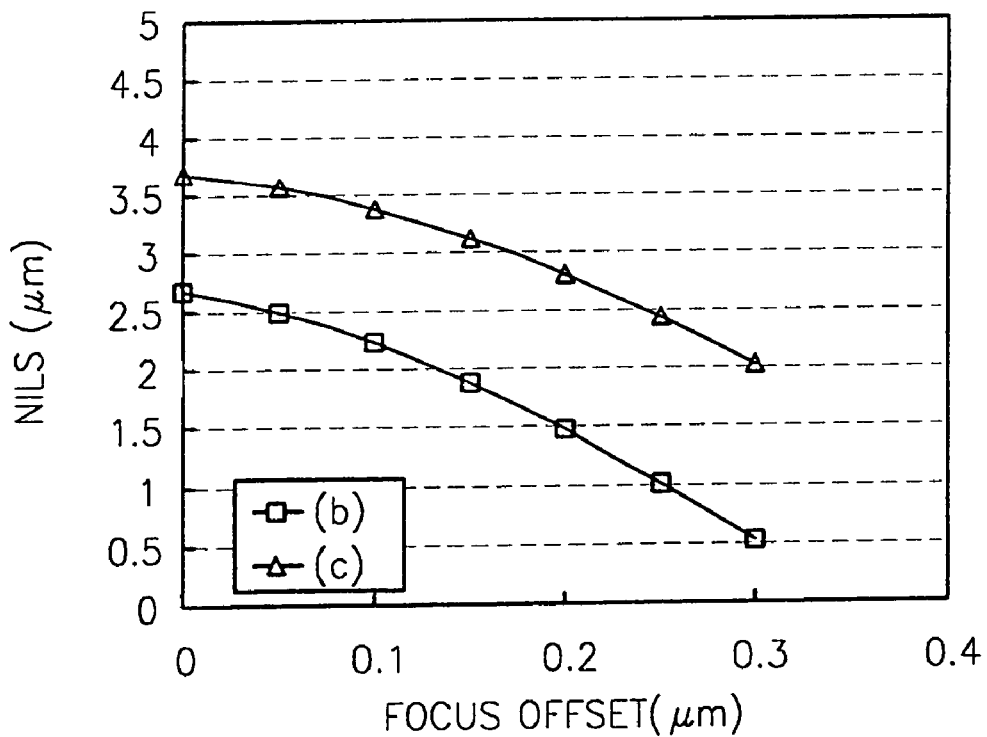
FIG. 7 is a graph illustrating a normalized image log-slope (NILS) metric with respect to a focus offset.

FIG. 7 is a graph illustrating normalized image log-slope metric (NILS) according to a focus offset with respect to (b) and (c) of FIG. 6. As shown in the graph of FIG. 7, NILS according to an embodiment of the present invention is always higher than that in the prior art. This fact can be expected from the graph of FIG. 3C. NILS is calculated by measuring a value of a logarithm of a gradient of the graph of FIG. 3C, partially differentiating the value of a logarithm with respect to X and multiplying the result by a line width of a floodlighting region. The higher the NILS, the steeper the gradient of the distribution curve of the intensity of light and the better a contrast for a pattern. Accordingly, using a photomask according to an embodiment of the present invention, produces a good contrast and high process latitude.

Therefore, according to the present invention, it is possible to attain a good contrast, a sufficient focus margin, and high process latitude. Thus, a fine and dense contact hole array can be easily formed using a combination of a photomask according to an embodiment of the present invention and customized illumination.

FIGS. 8 through 11 are diagrams illustrating a process of manufacturing a photomask according to an embodiment of the present invention, for example, the photomask 30 of FIG. 1A. Referring to FIGS. 8 through 11, (a) denotes an upper surface of a transparent substrate 100, and (b) denotes a cross section of the transparent substrate 100 shown in (a), taken along the line b-b'.

Figure 8:
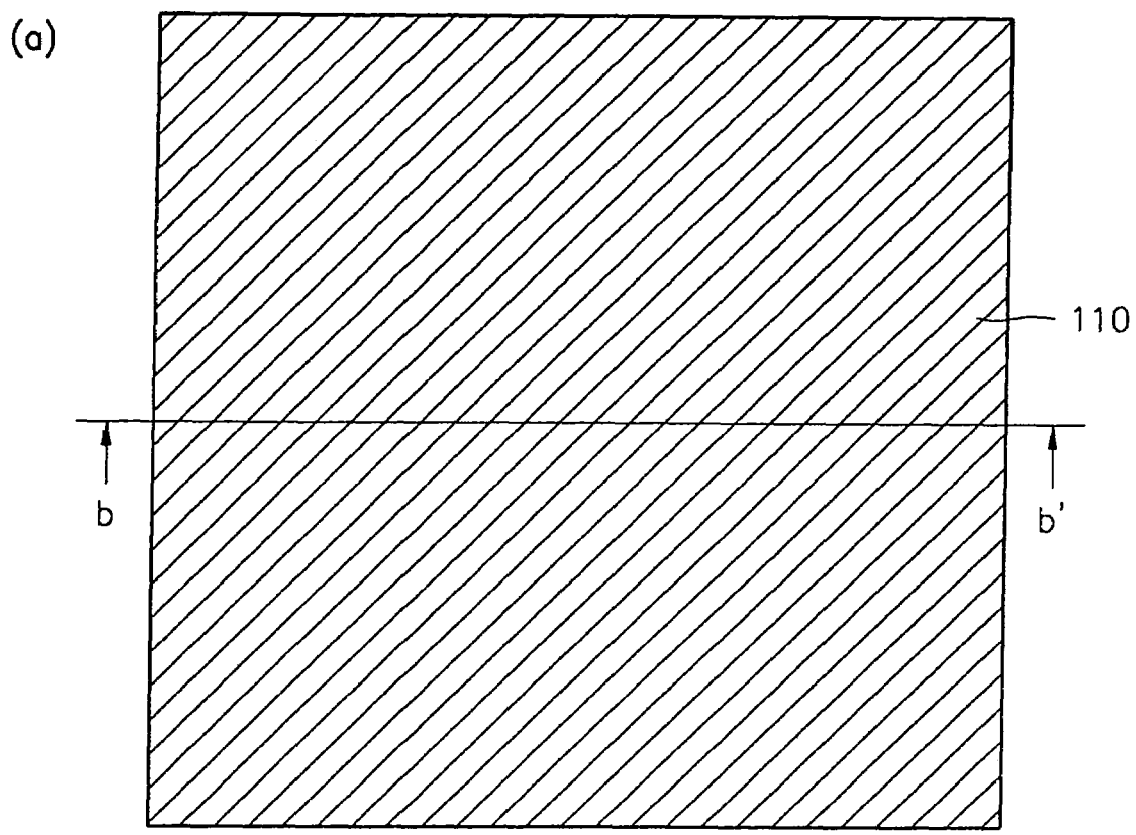
FIGS. 8 through 11 are cross-sectional views illustrating a process of fabricating the photomask of FIG. 1A.
Figure 8:
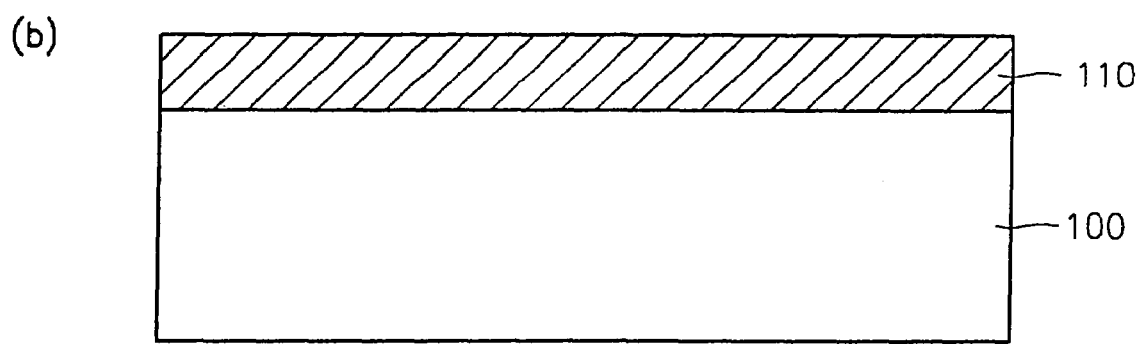

Referring to FIG. 8, an opaque layer 110, such as an opaque layer or a transmissive phase-shifting layer, is formed over the transparent substrate 100. The transparent substrate 100 may be formed of silica-based glass or quartz, and has parallel upper and lower surfaces.

The opaque layer 110 is an opaque layer that prevents transmission of incident light onto the transparent substrate 100 or a transmissive phase-shifting layer. Preferably, the opaque layer 110 is a metal layer formed by chemical or physical vapor deposition. For instance, the opaque layer 110 can be formed of Cr or MoSi to a thickness from 100 to 10000 Å. Alternatively, the opaque layer 110 can be a $Cr_2O_3$, Mo, Al, W, or Ti compound. The material used for and thickness of the opaque layer 110 can be vary depending on the processes used for fabricating a photomask.

Figure 9:
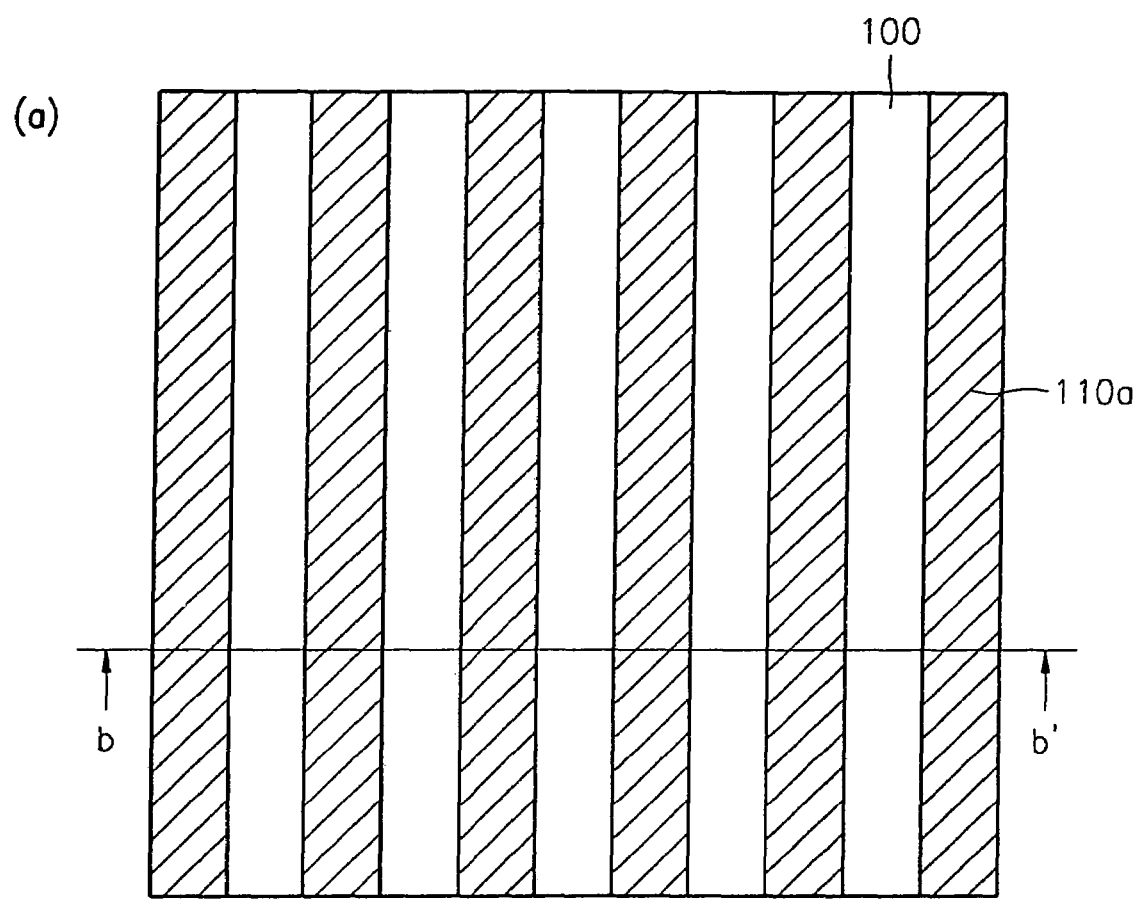
Figure 9:
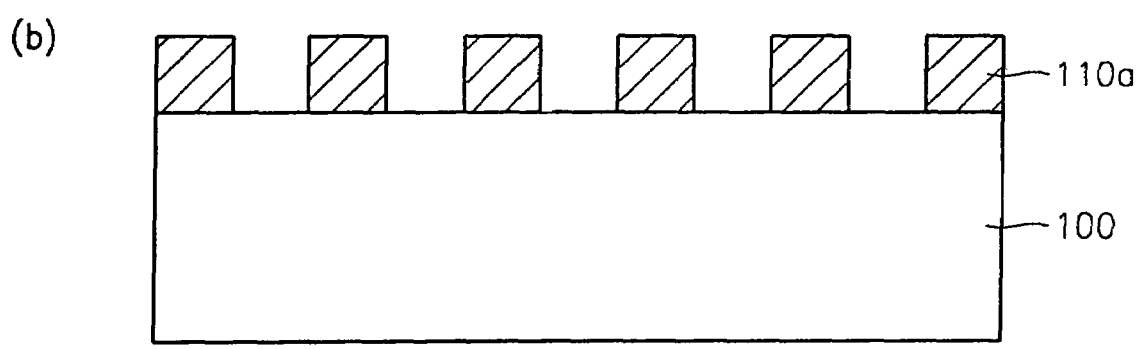

Next, as shown in FIG. 9, the opaque layer 110 is patterned to form a plurality of line-type opaque patterns 110a. Then, portions of the transparent substrate 100 between the opaque patterns 110a are referred to as floodlighting portions. The opaque pattern 110a may be a pattern used to form DRAM but the use of the opaque pattern 110a is not limited.

Figure 10:
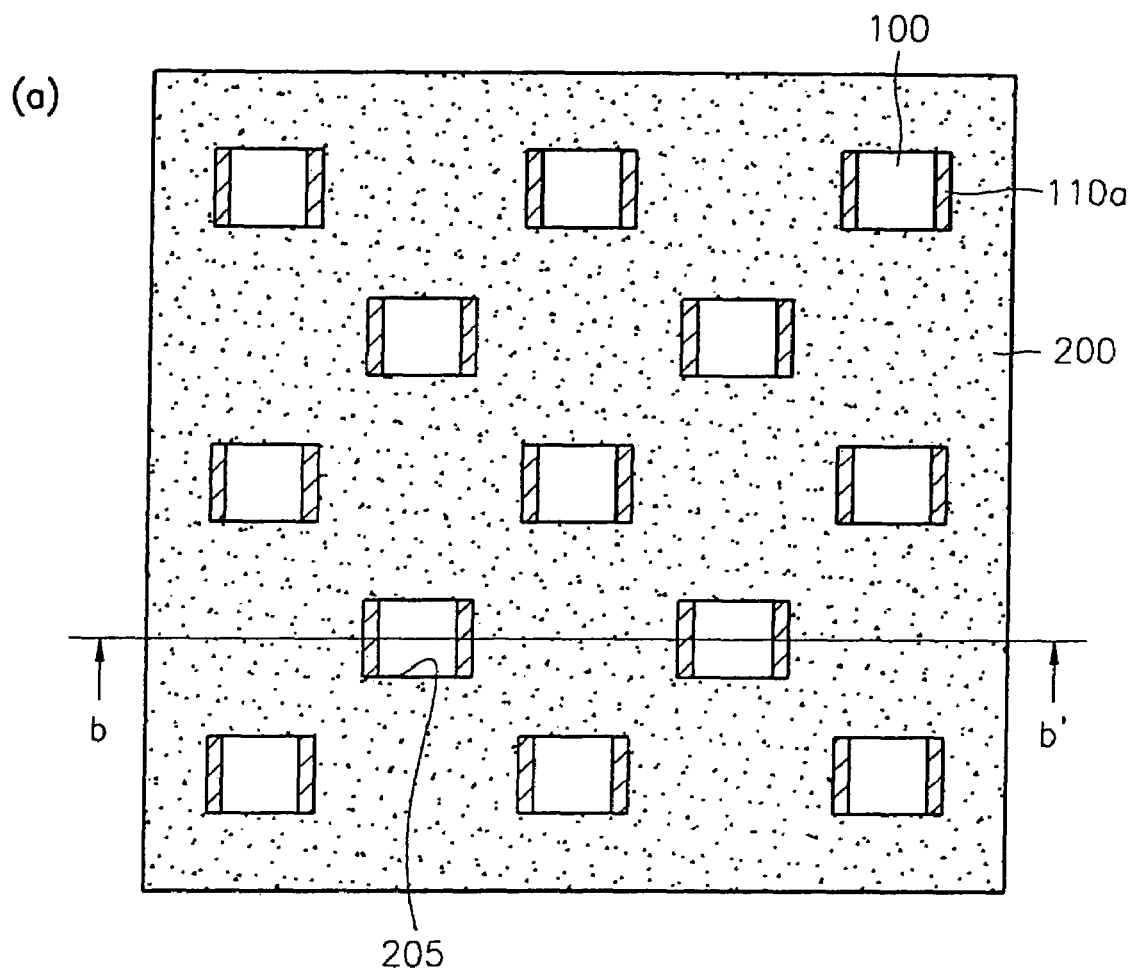
Figure 10:
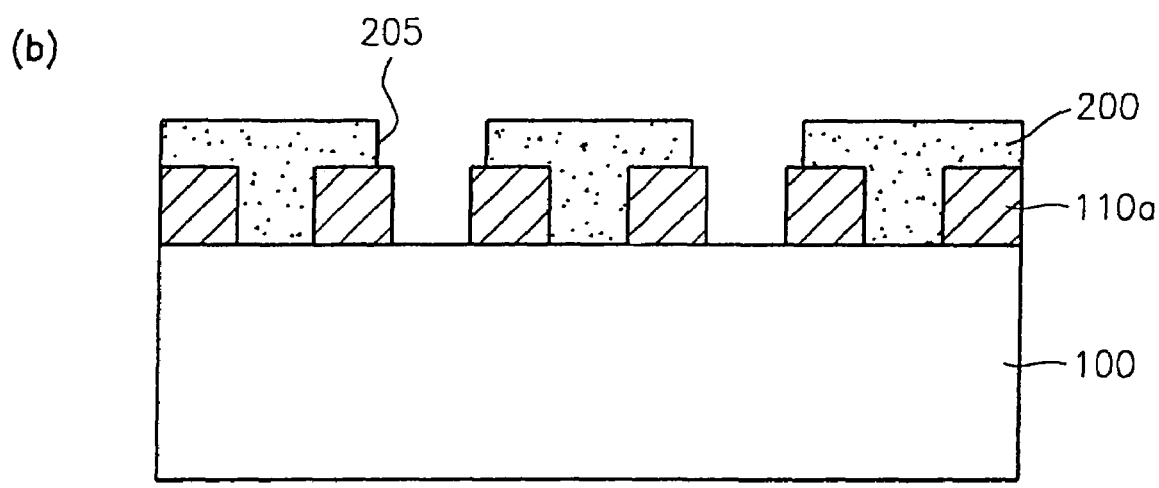

Referring to FIG. 10, a masking layer is formed on the transparent substrate 100 including the opaque patterns 110a, using an appropriate material. For instance, the transparent substrate 100 is treated with hexamethyldisilanzane (HMDS) and is spin-coated with a resist 200 at about 3000 rpm. Next, the resist 200 is pre-baked at 120° C. for about 90 seconds to evaporate a solvent therein. Thereafter, exposure is performed on the resist 200. If necessary, the resist 200 may be post-baked at 120° C. for about 90 seconds to increase the resolution thereof. Next, the resist 200 is developed by treating it with a developing solution, such as a tetramethylammonium hydroxide (TMAH) solution, for about 60 seconds. As a result, openings 205, which expose the transparent substrate 100 between the opaque patterns 110a, are serially formed at target positions.

Figure 11:
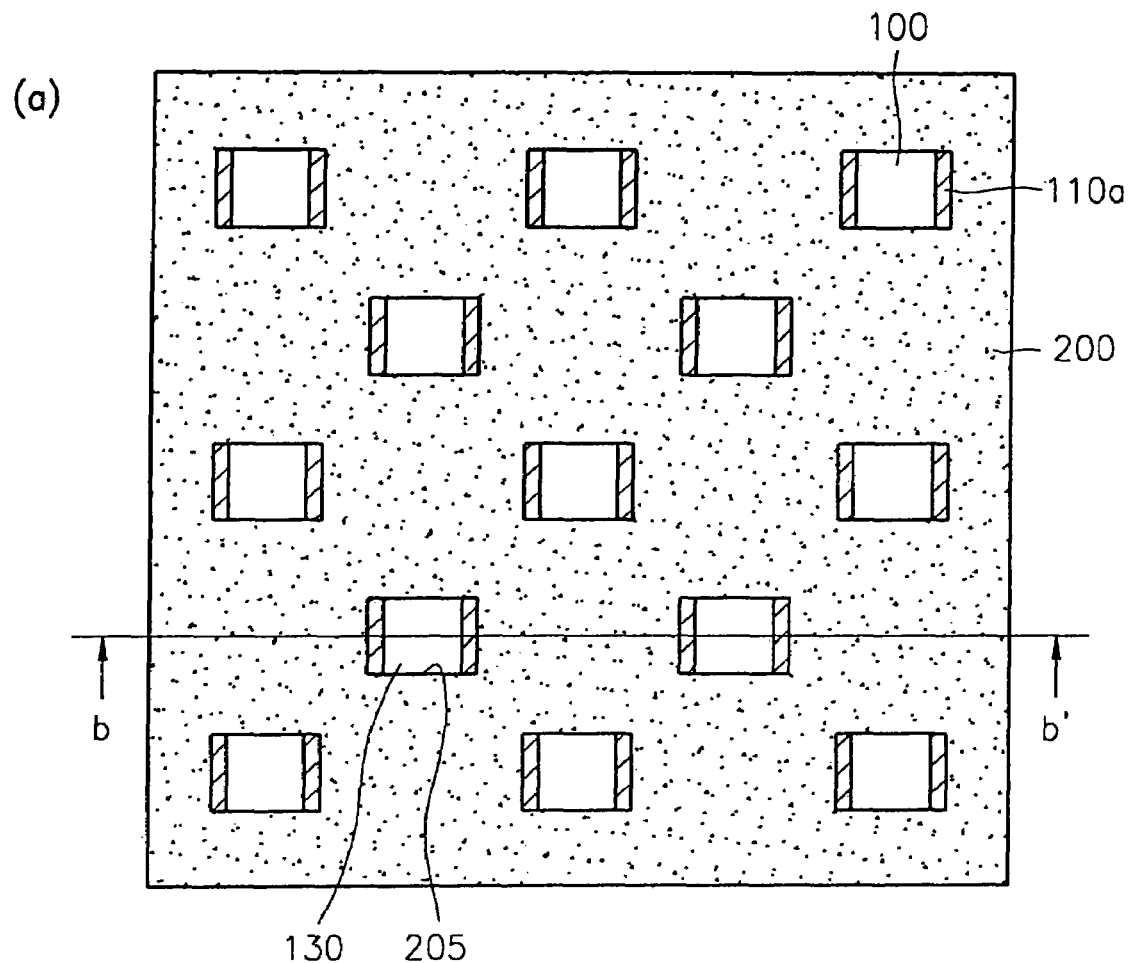
Figure 11:
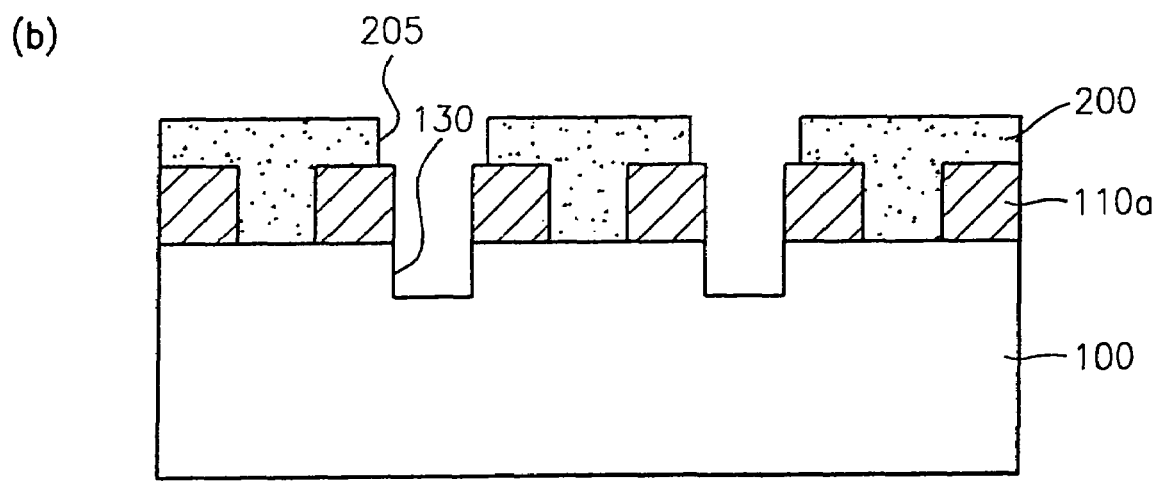

Referring to FIG. 11, to form recesses 130 that are desired phase defects, the transparent substrate 100 is etched to a predetermined depth using the patterned resist 200 as an etch mask. The recess 130 may be made using reactive ion beam etching (RIE) which etches exposed portions of the transparent substrate 100 without cutting the bottom of the opaque pattern 110a. During the RIE process, a gas containing F, $CHF_3$, and $CF_4$ may be used. A phase-shifting angle of incident light can be controlled by changing the etching depth of the transparent substrate 100, that is, the depth of the recess 130. The recess 130 is etched to a depth until the incident light is phase-shifted by 180°±30°, preferably, 180°. In the present invention, since an etch stopper is not used, the depth of the recess 130 is controlled according to etching time. Lastly, the patterned resist 200 is removed to obtain the photomask 30 of FIG. 1A.

Figure 12:
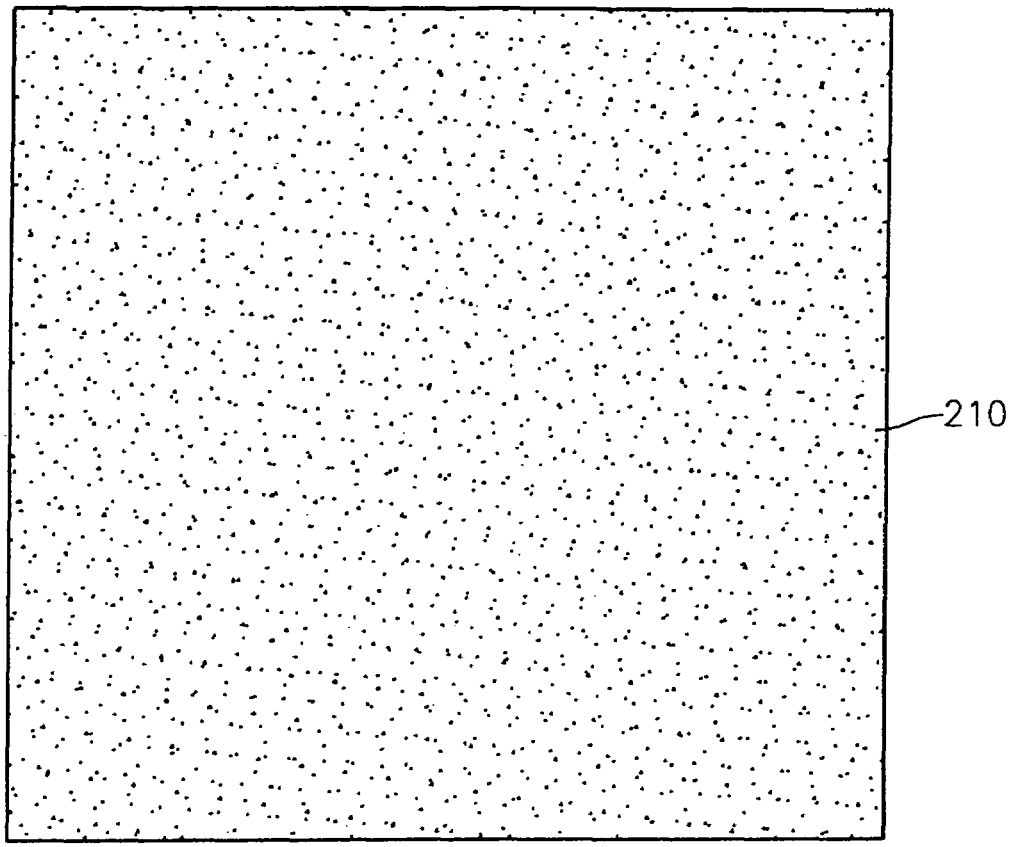
FIGS. 12 through 14 are cross-sectional views illustrating a process of fabricating the photomask of FIG. 2A.
Figure 12:
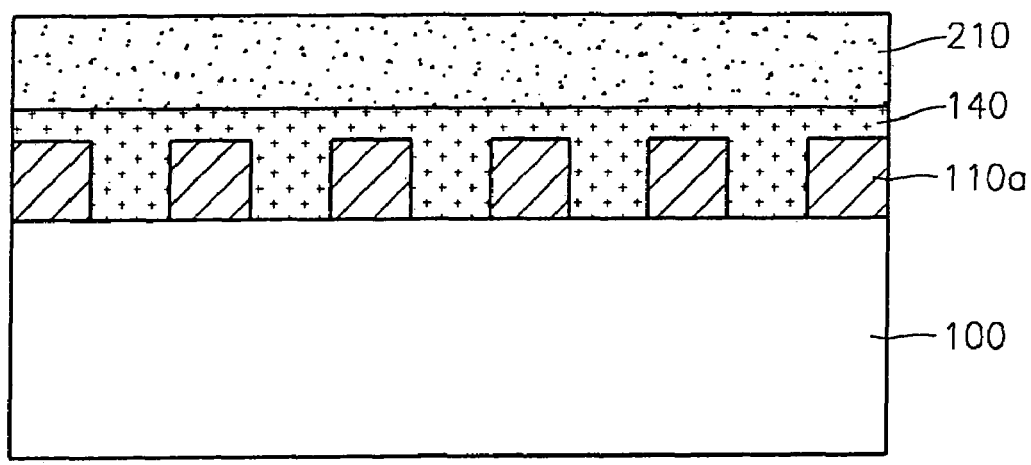
Figure 13:
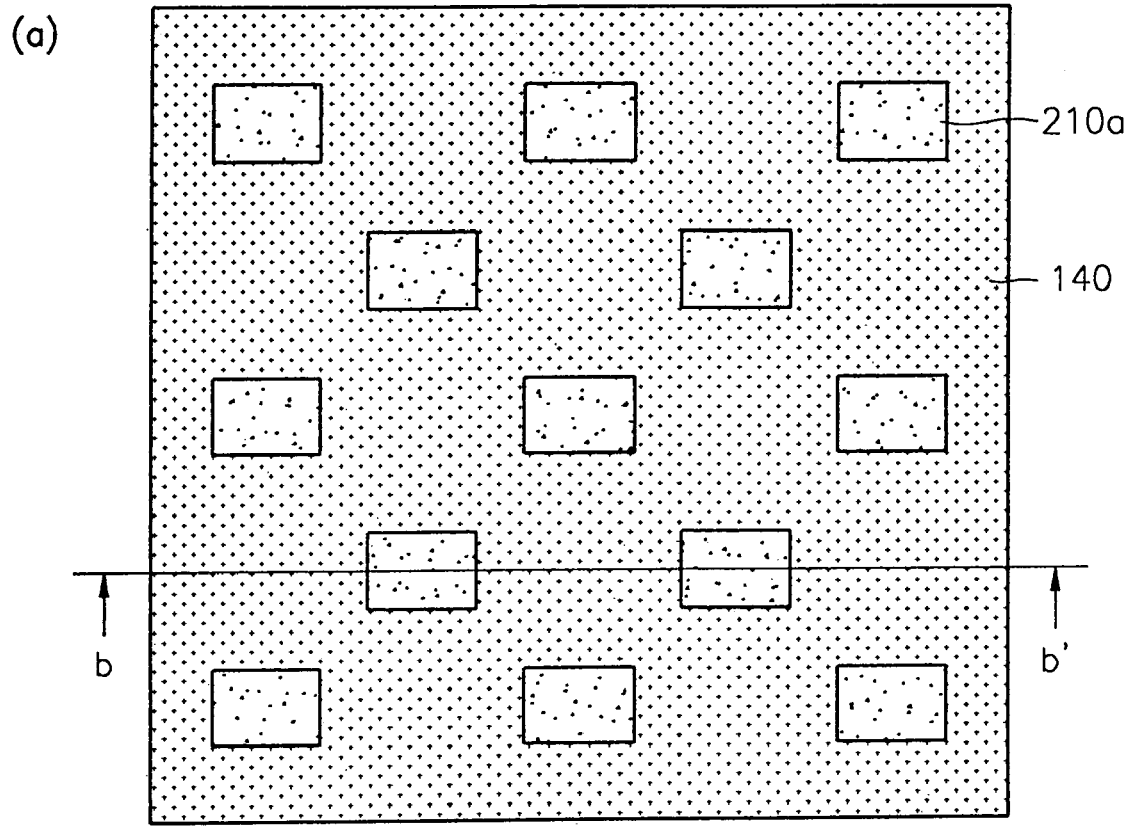
Figure 13:
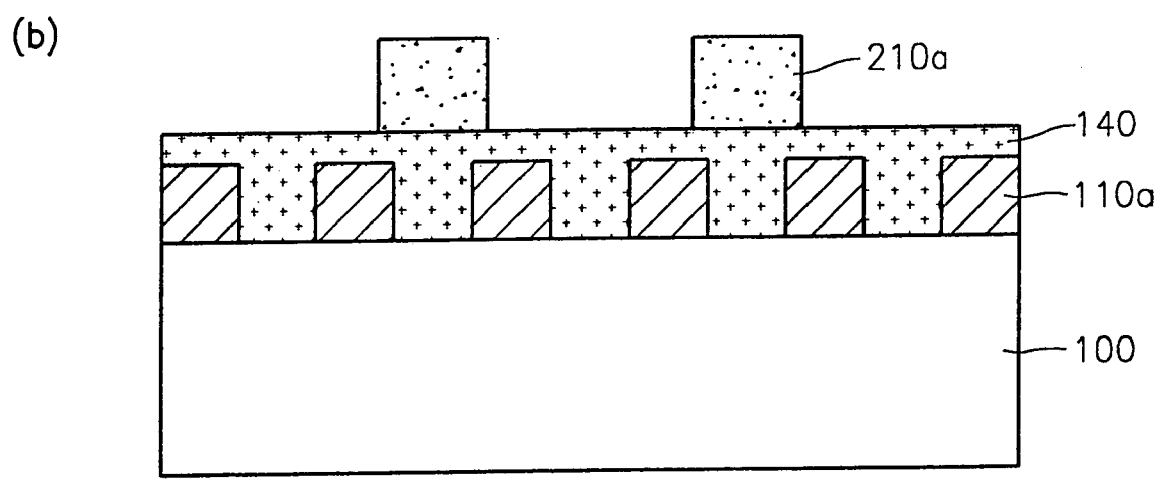
Figure 14:
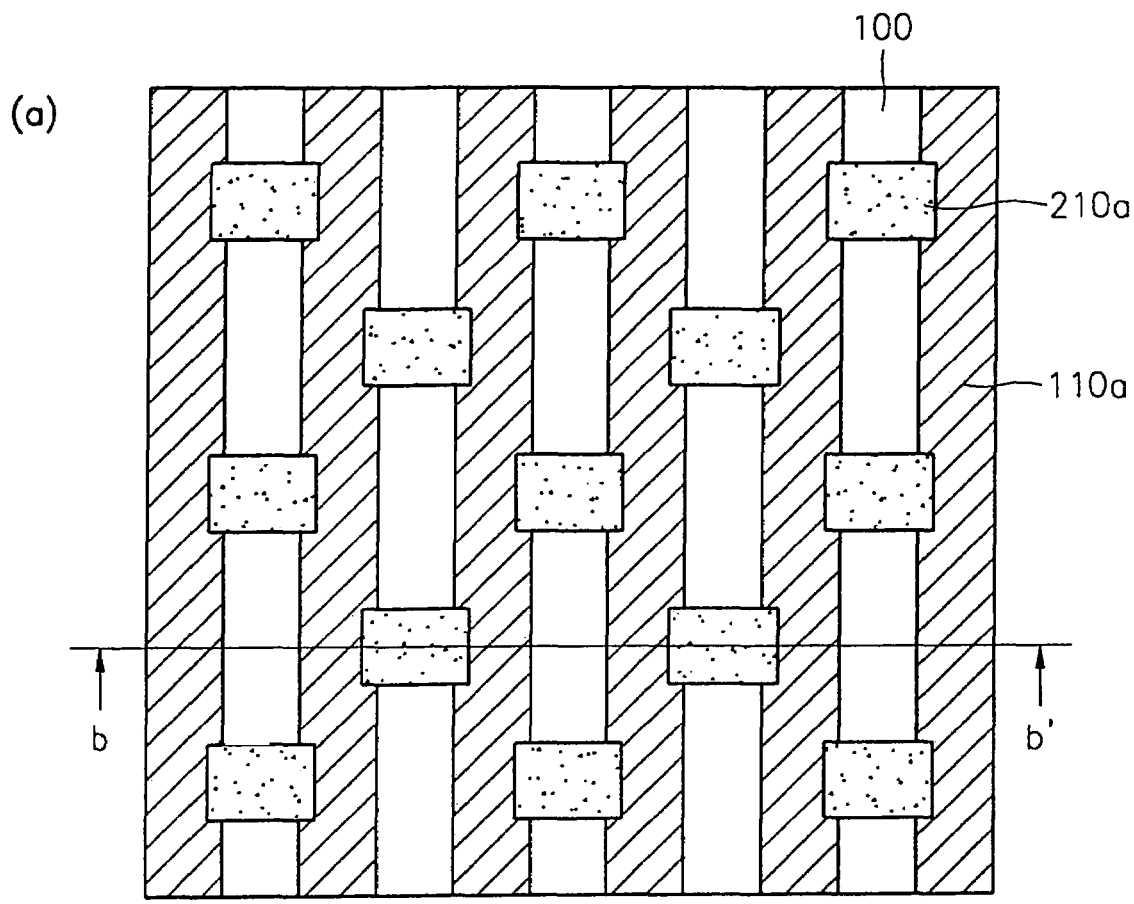
Figure 14:
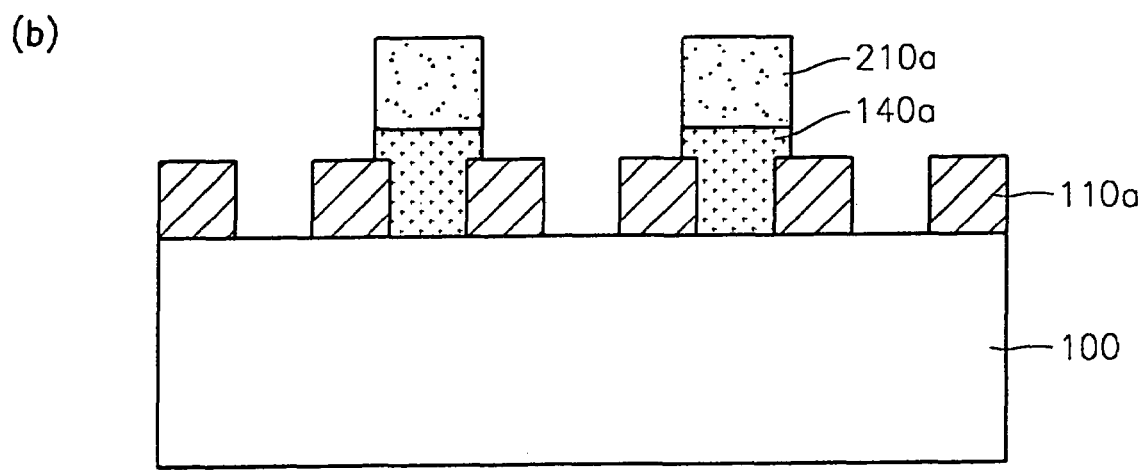

FIGS. 12 through 14 are diagrams illustrating a process of fabricating a photomask, such as, photomask 40 of FIG. 2A, according to an embodiment of the present invention. In FIGS. 12 through 14, (a) shows an upper surface of a transparent substrate 100 and (b) shows a cross section of the transparent substrate 100 of (a), taken along the line b-b'.

First, a plurality of line-type opaque patterns 110a are formed on the transparent substrate 100 as described with reference to FIGS. 8 and 9. Next, as shown in FIG. 12, an oxide layer 140, for example, a SOG layer, having a different refractive index from the transparent substrate 100 is formed on the transparent substrate 100 having the opaque patterns 110a. The oxide layer is formed to a thickness such that incident light is phase-shifted by 180°±30°, preferably, 180°. Next, a resist 210 which can be a masking layer, is applied onto the oxide layer 140.

Referring to FIG. 13, the resist 210 of FIG. 12 is patterned to form a resist pattern 210a that protects the oxide layer 140 of a region of the resultant structure on which the phase-shifting regions are to be formed.

Referring to FIG. 14, the oxide layer 140 of FIG. 13 is etched using the resist pattern 210a as an etch mask to form an oxide layer pattern 140a. The oxide layer 140 is etched using a general etching method. Lastly, the resist pattern 210a is removed to obtain the photomask 40 of FIG. 2A.

As described above, a photomask according to an embodiment of the present invention can be more easily manufactured than a general alternating PSM. In particular, the present invention is advantageous in that high technologies and methods for controlling etching of quartz are not required to manufacture a photomask which is useful in forming a contact hole array. Also, it is possible to form a photoresist pattern of good profile without a PSM of a complicated three-dimensional structure. Further, the intensity of incident light does not decrease during exposure and X-Y ellipticity can be easily controlled. For these reasons, a photomask according to an embodiment of the present invention can be extensively used when fabricating a semiconductor device.

What is claimed is:

1. A method of patterning a photoresist layer on a wafer, comprising the steps of:
   illuminating a photoresist layer on a wafer using a photomask comprising a plurality of line-type opaque patterns defining floodlighting portions for forming patterns and phase-shifting regions being arranged between the opaque patterns at predetermined intervals to define floodlighting portions for contact holes; and
   developing the illuminated photoresist.

2. The method of claim 1, wherein the illumination is set to optimize focusing of $0^{th}$ and $1^{st}$ components of incident light.

3. The method of claim 1, wherein the floodlighting portions for contact holes are used to form a bit line contact hole array for DRAM and the illumination is dipole illumination.

4. The method of claim 1, wherein the opaque patterns are opaque layers or transmissive phase-shifting layers.

5. The method of claim 1, wherein the phase-shifting regions are formed to phase-shift incident light by about $180°\pm30°$.

6. The method of claim 1, wherein the phase-shifting regions are recesses that are formed by etching portions of the transparent substrate to a predetermined depth.

7. The method of claim 1, wherein the phase-shifting regions are oxide layer patterns having a different refractive index from the transparent substrate.

8. The method of claim 7, wherein the oxide layer pattern is a SOG layer pattern.

* * * * *